United States Patent
Watanabe et al.

(10) Patent No.: US 8,481,909 B2
(45) Date of Patent: Jul. 9, 2013

(54) DETECTION APPARATUS AND RADIATION DETECTION SYSTEM

(75) Inventors: Minoru Watanabe, Honjo (JP); Chiori Mochizuki, Sagamihara (JP); Takamasa Ishii, Honjo (JP); Jun Kawanabe, Kodama-gun (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 13/295,536

(22) Filed: Nov. 14, 2011

(65) Prior Publication Data
US 2012/0126095 A1     May 24, 2012

(30) Foreign Application Priority Data
Nov. 22, 2010    (JP) ................... 2010-260522

(51) Int. Cl.
*H01L 27/14* (2006.01)
*H01L 31/0224* (2006.01)

(52) U.S. Cl.
USPC .......... 250/208.1; 257/458; 257/292

(58) Field of Classification Search
USPC ........ 250/208.1, 214.1, 214 R; 257/444–458, 257/290–292
See application file for complete search history.

(56) References Cited

U.S. PATENT DOCUMENTS

| | | | |
|---|---|---|---|
| 5,619,033 A | | 4/1997 | Weisfield |
| 6,183,970 B1 * | | 2/2001 | Okano et al. ............ 435/6.11 |
| 2004/0136251 A1 * | | 7/2004 | Mizuno et al. ............ 365/203 |

* cited by examiner

*Primary Examiner* — Seung C Sohn
(74) *Attorney, Agent, or Firm* — Canon U.S.A., Inc. IP Division

(57) ABSTRACT

A detection apparatus includes conversion elements and switch elements disposed below the conversion elements; insulating layers are disposed between the conversion elements and switch elements. Each conversion element includes a first electrode corresponding to a switch element. A second electrode extends over the plurality of conversion elements; and a semiconductor layer formed between the first electrodes and the second electrode extends over the plurality of conversion elements. Insulating layers include first regions located immediately below the first electrodes and a second region located between the first regions. A third electrode is disposed in the second region and between the insulating layers. The third electrode is supplied with a potential that sets a potential of a part where the second region is in contact with the semiconductor layer to a value between a potential of the second electrode and a potential of the first electrode.

7 Claims, 5 Drawing Sheets

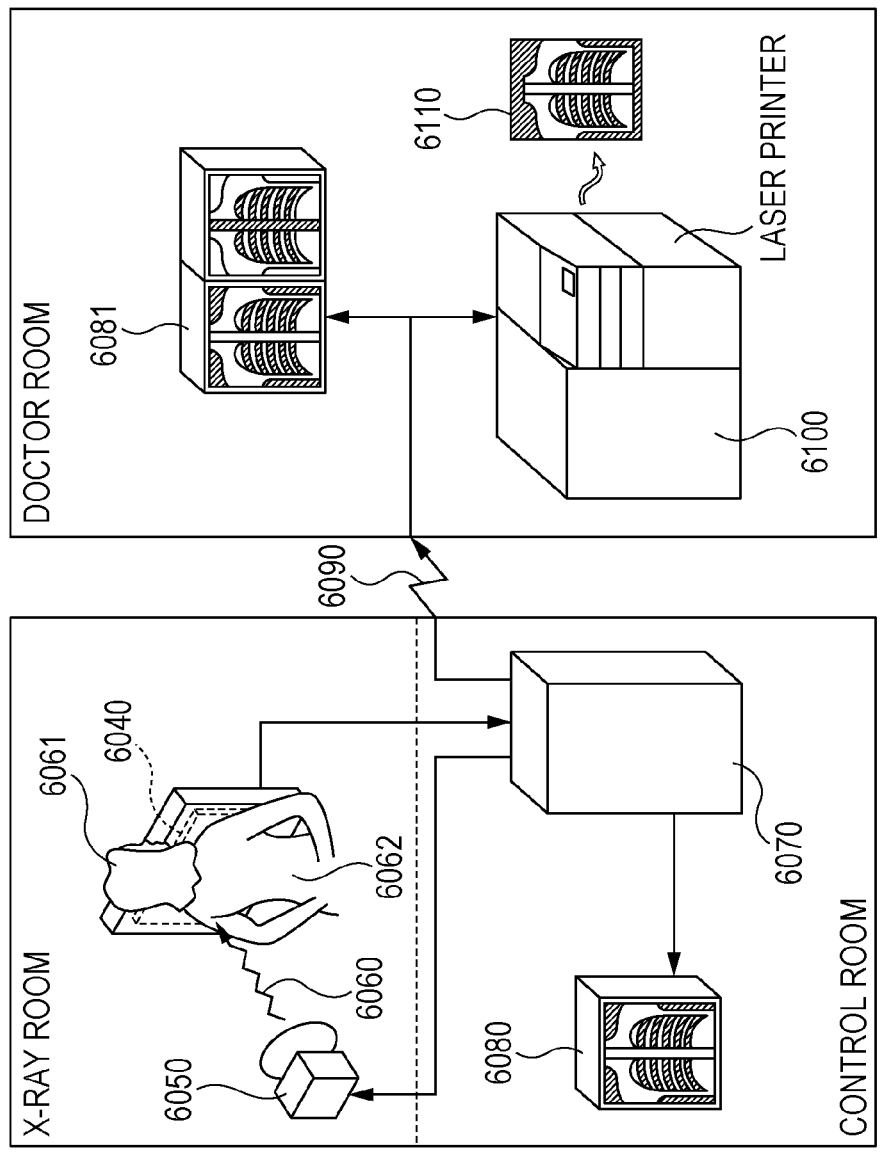

DETECTION APPARATUS AND RADIATION DETECTION SYSTEM

BACKGROUND OF THE INVENTION

1. Field of the Invention

The present invention relates to a detection apparatus and a radiation detection system applicable to a medical diagnostic imaging apparatus, a non-destructive testing apparatus, an analysis apparatus using radiation, or the like.

2. Description of the Related Art

In recent years, thin-film semiconductor production technology has been used in a detection apparatus or a radiation detection apparatus realized by a combination of a switch element such as a TFT (Thin-Film Transistor) and a conversion element such as a photoelectric conversion element.

As a proposal for a structure that allows an increase in sensitivity of a detection apparatus by increasing an aperture ratio of a conversion element, U.S. Pat. No. 5,619,033 discloses a pixel with a stacked structure in which a conversion element is disposed above a switch element. U.S. Pat. No. 5,619,033 also discloses a pixel with a stacked structure in which an electrode of a conversion element electrically connected to a switch element is divided such that each pixel has its own electrode (hereinafter, such an electrode will be referred to as an individual electrode), while a semiconductor layer and an opposing electrode of the conversion element extend over a plurality of pixels without being separated.

However, in the structure disclosed in U.S. Pat. No. 5,619,033, if the space between the individual electrodes is reduced to achieve a large aperture ratio and a small pixel pitch, charges collected by adjacent pixels can interfere with each other, which can degrade a characteristic such as a spatial resolution. In view of the above, Japanese Unexamined Utility Model Registration Application Publication No. 07-032968 discloses a technique in which a dummy electrode is disposed between individual electrodes of adjacent conversion elements and the dummy electrode is maintained at a particular potential to attract a charge generated in a region between adjacent pixels.

However, if a dummy electrode is disposed between individual electrodes of adjacent conversion elements as in the technique in Japanese Unexamined Utility Model Registration Application Publication No. 07-032968, the result is an increase in the distance between adjacent individual electrodes. This can in effect cause a reduction in the aperture ratio of the detection apparatus. Furthermore, in the techniques disclosed in U.S. Pat. No. 5,619,033 and Japanese Unexamined Utility Model Registration Application Publication No. 07-032968, the increase in the distance between individual electrodes makes it difficult for the individual electrodes to absorb electric charges generated in a semiconductor layer in a region between the individual electrodes, and thus the semiconductor layer in such a region between the individual electrodes functions as a dead region in which no charge can be generated, which makes it difficult to increase the overall sensitivity of the detection apparatus.

SUMMARY OF THE INVENTION

In an aspect, the present invention provides a detection apparatus comprising a set of a plurality of conversion elements disposed in the form of a matrix on a substrate, a set of a plurality of switch elements corresponding to the respective conversion elements and disposed in the form of a matrix between the substrate and the conversion elements, and a set of a plurality of insulating layers disposed between the set of the conversion elements and the set of the switch elements. Each conversion elements includes a corresponding one of a plurality of first electrodes that are separated from each other and that are connected to the respective switch elements in a one-to-one manner. Each conversion element further includes a second electrode extending over the plurality of conversion elements and a semiconductor layer formed between the first electrodes and the second electrode that extends over the plurality of conversion elements. The set of the plurality of insulating layers includes a plurality of first regions located immediately below the respective first electrodes and also includes a second region located between the first regions. A third electrode is disposed between the plurality of insulating layer in each second region and the third electrode is supplied with a potential that provides a potential of a part where the second region of the plurality of insulating layers is in contact with the semiconductor layer such that the potential of the part is set to be between a potential of the second electrode and a potential of the first electrode.

Advantageously, the detection apparatus with the stacked structure according to the embodiments of the present invention provides a high sensitivity and a high spatial resolution.

Further features of the present invention will become apparent from the following description of exemplary embodiments with reference to the attached drawings.

BRIEF DESCRIPTION OF THE DRAWINGS

FIG. 5 is a schematic diagram illustrating a radiation detection system according to an embodiment of the present invention.

DESCRIPTION OF THE EMBODIMENTS

The present invention is described in detail below with reference to embodiments in conjunction with the accompanying drawings.

In the present description, the term "radiation" is used to describe various kinds of radiations including particle beams such as an alpha ray, a beta ray, a gamma ray, etc. radiated via radioactive decay, and other beams with high energy similar to that of particle beams. For example, an X-ray, a cosmic ray, etc., also fall in the scope of radiation. Furthermore, in the present description, a conversion element refers to a semiconductor device configured to convert radiation or light into an electric signal.

First Embodiment

Figure 1A:
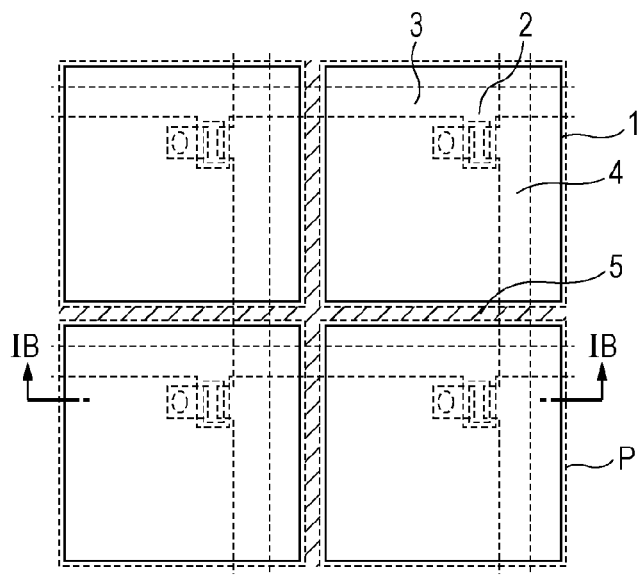
FIGS. 1A, 1B, and 1C are, respectively, a plan view, a cross-sectional view, and an enlarged cross-sectional view of a pixel of a detection apparatus according to an embodiment of the present invention.
Figure 1B:
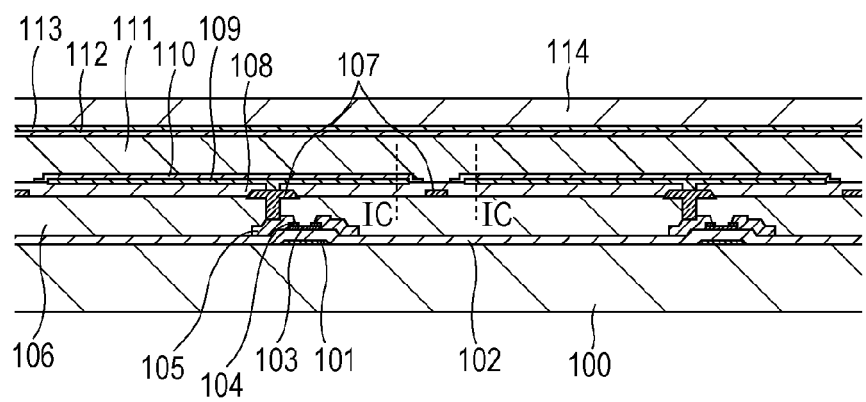

First, a first embodiment of the present invention is described. In a detection apparatus according to the first embodiment of the present invention, as can be seen from FIG. 1A showing a plan view and FIG. 1B showing a cross-sectional view taken along line IB-IB of FIG. 1A, a plurality of pixels P are disposed adjacent to each other in the form of a matrix of rows and columns on a substrate 100 having an insulating surface (hereinafter, the substrate 100 is also referred to as an insulating substrate). Each pixel P on the substrate includes a conversion element including a second semiconductor layer 111 disposed between a fourth conductive layer 109 serving as a first electrode 1 and a fifth conductive layer 113 serving as a second electrode. In the present embodiment, each pixel further includes a switch element 2 that is disposed between the substrate 100 and the first electrode 1 of the conversion element. The switch element 2 is electrically connected to the first electrode 1. That is, a plurality of conversion elements and a plurality of switch elements (the switch elements disposed between the insulating substrate 100 and corresponding conversion elements) are respectively arranged in the form of a matrix on the insulating substrate 100. The switch elements 2 are disposed such that the switch elements correspond in a one-to-one manner to the conversion elements. Each conversion element includes a first electrode 1 (formed by the fourth conductive layer 109) that is connected a corresponding switch element 2. Each of the conversion elements includes a corresponding one of the first electrodes 1 connected, with a one-to-one correspondence, to the respective switch elements 2. A second electrode (formed by the fifth conductive layer 113) extends over the plurality of conversion elements; and a semiconductor layer 111 formed between first electrodes 1 and the second electrode extends over the plurality of conversion elements.

In the present embodiment, a thin film transistor (hereinafter, referred to as a TFT) is used as an example of a switch element. Each switch element 2 is electrically connected to a signal line 4 formed by a second conductive layer 105. The TFT includes a first conductive layer 101, a first insulating layer 102, a first semiconductor layer 103, a first impurity semiconductor layer 104 of a first conductivity type, and a second conductive layer 105, which are formed on the insulating substrate (substrate 100).

In each switch element 2, the first conductive layer 101 is used as a control electrode. The first insulating layer 102 is used as a gate insulating film. The first semiconductor layer 103 is used as a channel. The first impurity semiconductor layer 104 is used as an ohmic contact layer. The second conductive layer 105 is used as a first or second main electrode (a source electrode or a drain electrode). The control electrode of the TFT is electrically connected to the control line 3 realized by the first conductive layer 101. In a case where the detection apparatus according to the present embodiment is a radiation detection apparatus and includes an indirect-type conversion element (photoelectric conversion element) as a conversion element for converting light to a charge, a wavelength conversion element (not shown) for converting radiation into light is disposed at a location further away from the insulating substrate 100 than the fourth insulating layer 114.

In a case where the conversion element is a direct-type conversion element that directly converts a radiation into an electrical charge, no additional wavelength conversion element is required. In this case, a compound semiconductor material such as amorphous selenium may be used as a material for the second semiconductor layer 111.

Note that in the present embodiment, an example of the conversion element is a PIN-type photodiode. In this case, the conversion element includes a second impurity semiconductor layer 110 of a first conductivity type (n type) between the fourth conductive layer 109 and the second semiconductor layer 111, and further includes a third impurity semiconductor layer 112 of a second conductivity type (p type) opposite to the first conductivity type between the fifth conductive layer 113 and the second semiconductor layer 111.

Note that the fourth conductive layer 109 serving as the first electrode 1 and the second impurity semiconductor layer 110 are divided into parts corresponding to the respective pixels, while the second semiconductor layer 111, the third impurity semiconductor layer 112, and the fifth conductive layer 113 extend over a plurality of pixels. By employing the structure described above, it becomes possible to achieve a high aperture ratio for the conversion element, which makes it possible for the detection apparatus to have an enhanced sensitivity.

A plurality of insulating layers are disposed as an insulating element between the fourth conductive layer 109 serving as the first electrode 1 of the conversion element and the second conductive layer 105 serving as the first or second main electrode on the top of the switch element 2. More specifically, in the present embodiment, a second insulating layer 106 and a third insulating layer 108 are disposed as the plurality of insulating layers between the second conductive layer 105 and the fourth conductive layer 109. The insulating element includes a plurality of first regions located immediately below the plurality of first electrodes 1 and a second region located between adjacent first regions. Between the plurality of insulating layers of the insulating element, there is provided a third conductive layer 107 used as a contact for electrically connecting the second conductive layer 105 serving as the first or second main electrode of the switch element 2 to the fourth conductive layer 109 serving as the first electrode 1.

In the second region of the insulating element, the third conductive layer 107 located between two adjacent insulating layers of the plurality of insulating layers of the insulating element is used as a pixel isolation electrode 5 to which a particular potential is supplied. Note that the pixel isolation electrode 5 corresponds to the third electrode in the aspect according to the invention.

Applying a particular potential to the pixel isolation electrode 5 causes the potential of a part (interface) between the second region of the insulating element and the second semiconductor layer 111 to be set, at least in a partial area thereof, to be closer to a potential of the fifth conductive layer 113 serving as the second electrode than a reference potential of the first electrode 1 is to the potential of the fifth conductive layer 113. Note that hereinafter, the area between the second region of the insulating element and the second semiconductor layer 111 will be referred to as an interface. That is, the interface between the second region of the insulating element and the second semiconductor layer 111 is set, at least in a partial area thereof, to have a potential between the potential of the fifth conductive layer 113 and the potential of the first electrode 1.

The reference potential is supplied from a reading circuit (not shown) when the switch element turns on and the conversion element is electrically connected to the reading circuit via the signal line 4. That is, the reference potential is the potential that the first electrode 1 has at a time at which the accumulation state starts. Note that the potential of the first electrode 1 changes due to the accumulation of the electric charge by the conversion element in response to the incidence thereupon of radiation or light.

Note that in the present embodiment, the PIN type photodiode is used as the conversion element and is reversely biased such that a potential of the first electrode (the fourth conductive layer 109) is higher than the potential of the fifth conductive layer 113 serving as the second electrode. Therefore, when electrons move to the first electrode 1 as a result of the accumulation, the potential of the first electrode 1 decreases toward the potential of the fifth conductive layer 113. If the conversion element is not saturated, the potential of the first electrode 1 does not reach the potential of the fifth conductive layer 113. The bias applied to the conversion element is generally set taking into the account of a predicted amount of incident radiation or light such that no saturation occurs in the conversion element.

In the present embodiment, the potential of the interface is to satisfy the above-described condition at least in a partial area of the interface even when the conversion element is in the accumulation state.

By realizing the pixel isolation electrode 5 by the conductive layer that is different from the fourth conductive layer 109 serving as the first electrode 1 and that is disposed between the plurality of insulating layers, it is possible to reduce the distance of the space between first electrodes 1 of adjacent pixels. In this structure, even in regions between first electrodes 1 of adjacent pixels, the second semiconductor layer 111 can receive an influence of an electric field generated between the first electrodes 1 (the fourth conductive layer 109) and the second electrode (the fifth conductive layer 113), and thus it is possible to generate a charge in these regions in response to the incidence thereupon of radiation or light.

In this structure, even when the distance between first electrodes 1 of adjacent pixels is not reduced, the electrical potential of the pixel isolation electrode 5 causes an electric field generated between the first electrodes 1 (the fourth conductive layer 109) and the second electrode (the fifth conductive layer 113) to expand, and thus charges are also generated in response to radiation or light in the semiconductor layer in the region in which the electric field expands. The generation of charges in such regions results in an effective increase in aperture ratio, which results in an increase in the overall sensitivity of the detection apparatus.

Furthermore, a potential gradient occurs between the potential of the first electrode 1 and the potential of the at least partial region of the interface, and this potential gradient causes carriers to move towards the first electrode 1 and not towards the interface. Such a potential gradient produced by the potential of the interface in the region between the first electrodes 1 of adjacent pixels prevents carriers of a first type (electrons) generated in the conversion element of each pixel from moving to the first electrode of the adjacent pixel, even in the structure in which the second semiconductor layer 111 is disposed such that it extends over the plurality of pixels.

Furthermore, because the potential of the at least partial region of the interface is between the potential of the fifth conductive layer 113 and the potential of the first electrode 1, carriers of a second type (holes) move to the fifth conductive layer 113 while the carriers of the first type (electrons) move to the first electrode 1. This suppresses the accumulation of the carriers of the first and the second types at the interface of the second semiconductor layer 111 and the third conductive layer 107.

Figure 1C:
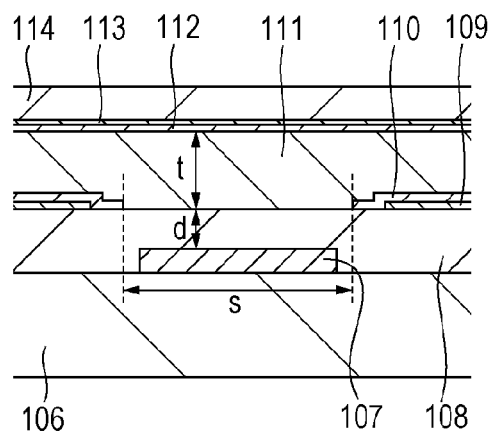

Next, referring to FIG. 1C illustrating an enlarged view of a part IC-IC of FIG. 1B, an explanation is given below as to the particular potential to be applied to the pixel isolation electrode 5.

In FIG. 1C, t denotes the film thickness of the second semiconductor layer 111, and d denotes the film thickness of the third insulating layer 108 disposed between the second semiconductor layer 111 and the third conductive layer 107 serving as the pixel isolation electrode 5. Let ∈1 denote the dielectric constant of the second semiconductor layer 111 and let ∈2 denote the dielectric constant of the third insulating layer 108. Furthermore, let it be assumed that when the accumulation state starts in the conversion element, the potential of the fifth conductive layer 113 serving as the second electrode is V1 and the potential supplied to the pixel isolation electrode 5 (the third conductive layer 107) is V2. In this case, the potential Vi of at least a partial area of the interface of the second semiconductor layer 111 and the third insulating layer 108 is given by equation (A) shown below.

$$V_i = \frac{(\varepsilon_1/t)V_1 + (\varepsilon_2/d)V_2}{(\varepsilon_2/d) + (\varepsilon_1/t)} \quad (A)$$

If the potential Vi is equal to a reference potential Vx that is the potential that the first electrode 1 has when the accumulation state starts in the conversion element, or if a difference between the potential Vi and the potential V1 of the second electrode is greater than a difference between the reference potential Vx and the potential V1 (i.e., if |Vi−V1|>|Vx−V1|, then the carriers of the first type (electrons) generated in the second semiconductor layer between the edge of the first electrode 1 and the second electrode are attracted to the interface. As a result, the carriers of the first type (electrons) are accumulated at the interface in the region between the first electrodes 1 of adjacent pixels. This causes the potential of the interface to change. As a result, the dead region of the second semiconductor layer between the interface and the second electrode increases.

In view of the above, the potential Vi of the interface is set to be closer to the potential V1 of the second electrode than the reference potential Vx of the first electrode 1 is to the potential V1 such that the carriers of the first type are attracted to the first electrode 1. That is, the potential Vi is set such that a following condition is satisfied.

|V1−Vi|<|V1−Vx| where |Vi−Vx|≠0

Figure 2A:
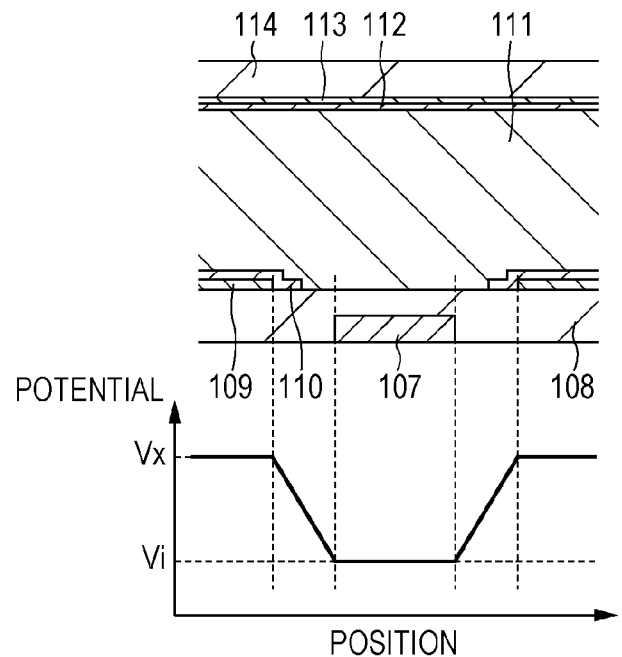
FIGS. 2A and 2B are enlarged cross-sectional views and associated potential gradient diagrams of a detection apparatus according to an embodiment of the present invention.

As a result of the setting of V1 in the above-described manner, a potential gradient appears between the surface the first electrode 1 and the interface as shown in FIG. 2A and thus the carriers move not to the interface but to the first electrode 1. This prevents the carriers of the first type (electrons) generated in the conversion element of a particular pixel from moving toward the first electrode of a pixel adjacent to the pixel of interest.

If the potential Vi of the interface is equal to the potential V1 of the second electrode, then there is no potential difference between them, i.e., |V1−Vi|=0. Therefore, in a case where the distance between the adjacent first electrodes is large, a dead region can occur in the second semiconductor layer 111 between the adjacent first electrodes.

In a case where the potential Vi of the interface is more different from the reference potential Vx of the first electrode 1 than from the potential V1 of the second electrode, the carriers of the second type (holes) generated in the second semiconductor layer in a region between the edge of the first electrode 1 and the second electrode are attracted to the interface and accumulated at the interface in the area between the adjacent first electrodes 1. This results in an increase in recombination probability. As a result, a dead region appears.

In view of the above, the potential Vi of the interface is set to be closer to the reference potential Vx of the first electrode 1 than the potential V1 of the second electrode is to the reference potential Vx such that the carriers of the second type are attracted to the second electrode. That is, the potential Vi of the interface is set such that |Vi−Vx|<|V1−Vx|. In this state, the particular potential V2 applied to the pixel isolation electrode 5 is to satisfy a condition described by mathematical expressions (B) to (E) shown below.

$$\left|V_1 - \frac{(\varepsilon_1/t)V_1 + (\varepsilon_2/d)V_2}{(\varepsilon_2/d) + (\varepsilon_1/t)}\right| < |V_1 - V_x| \qquad (B)$$

$$\left|\frac{(\varepsilon_1/t)V_1 + (\varepsilon_2/d)V_2}{(\varepsilon_2/d) + (\varepsilon_1/t)} - V_x\right| \neq 0 \qquad (C)$$

$$\left|V_1 - \frac{(\varepsilon_1/t)V_1 + (\varepsilon_2/d)V_2}{(\varepsilon_2/d) + (\varepsilon_1/t)}\right| \neq 0 \qquad (D)$$

$$\left|\frac{(\varepsilon_1/t)V_1 + (\varepsilon_2/d)V_2}{(\varepsilon_2/d) + (\varepsilon_1/t)} - V_x\right| < |V_1 - V_x| \qquad (E)$$

When the particular potential V2 of the pixel isolation electrode 5 satisfies the above condition, the potential Vi of the interface of the third insulating layer 108 and the second semiconductor layer 111 in the area between the adjacent first electrodes 1 is fixed to a value between the reference potential Vx of the first electrode 1 and the potential V1 of the second electrode. As a result, as shown in FIG. 2A, a potential gradient occurs between the potential of the first electrode 1 and the potential of the at least partial region the interface such that the potential gradient causes the carriers to move to not the interface but the first electrode 1. Because the interface in the area between the adjacent first electrodes 1 has a potential that produces such a potential gradient, it is possible to prevent the carriers of the first type (electrons) from moving to the first electrode of the pixel adjacent to the pixel of interest even in the structure in which the second semiconductor layer 111 extends over the plurality of pixels.

In the present embodiment, because the PIN-type photodiode is used that includes the second impurity semiconductor layer 110 of the first conductivity type (n type) and the third impurity semiconductor layer 112 of the second conductivity type (p type), the particular potential V2 is to satisfy a condition (F) shown below.

$$V_1 < \frac{(\varepsilon_1/t)V_1 + (\varepsilon_2/d)V_2}{(\varepsilon_2/d) + (\varepsilon_1/t)} < V_x \qquad (F)$$

In a case where the second impurity semiconductor layer 110 is of the second conductivity type (p type) and the third impurity semiconductor layer 112 is of the first conductivity type (n type), the particular potential V2 is to satisfy a following condition.

$$V_x < \frac{(\varepsilon_1/t)V_1 + (\varepsilon_2/d)V_2}{(\varepsilon_2/d) + (\varepsilon_1/t)} < V_1 \qquad (F')$$

This makes it possible to obtain a stable potential gradient between the first electrode 1 and the interface without causing an expansion of the dead region in the second semiconductor layer 111 in the region between the adjacent first electrodes 1, and thus it becomes possible to improve the sensitivity and the spatial resolution of the detection apparatus. This is also true for a MIS-type sensor in which an interlayer insulating layer for completely isolating carriers of both positive and negative types is used instead of the second impurity semiconductor layer 110 and an impurity semiconductor layer of the first conductivity type (n type) is used as the third impurity semiconductor layer 112.

In a case where the potential of the first electrode 1 changes from Vx to Vy due to a charge generated by radiation or light incident on the second semiconductor layer 111, if the conversion element is not in a saturated state, the particular potential V2 applied to the pixel isolation electrode 5 is to satisfy a condition represented by mathematical expressions (B') to (E') shown below.

$$\left|V_1 - \frac{(\varepsilon_1/t)V_1 + (\varepsilon_2/d)V_2}{(\varepsilon_2/d) + (\varepsilon_1/t)}\right| < |V_1 - V_y| \qquad (B')$$

$$\left|\frac{(\varepsilon_1/t)V_1 + (\varepsilon_2/d)V_2}{(\varepsilon_2/d) + (\varepsilon_1/t)} - V_y\right| \neq 0 \qquad (C')$$

$$\left|V_1 - \frac{(\varepsilon_1/t)V_1 + (\varepsilon_2/d)V_2}{(\varepsilon_2/d) + (\varepsilon_1/t)}\right| \neq 0 \qquad (D')$$

$$\left|\frac{(\varepsilon_1/t)V_1 + (\varepsilon_2/d)V_2}{(\varepsilon_2/d) + (\varepsilon_1/t)} - V_y\right| < |V_1 - V_y| \qquad (E')$$

Figure 2B:
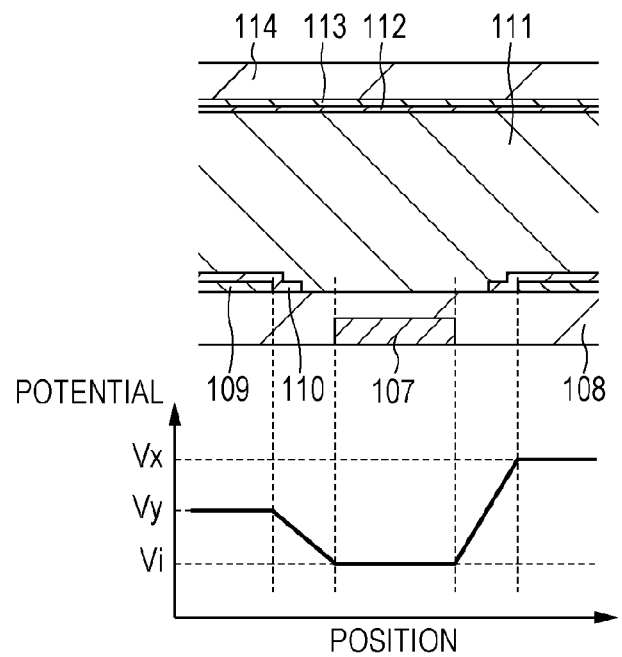

When the potential of the pixel isolation electrode 5 satisfies the condition represented by the above mathematical expressions, even if a charge is generated only in one of two adjacent pixels, a potential gradient is generated as shown in FIG. 2B such that carriers are moved not to the interface but to the first electrode 1. Because the interface in the area between the adjacent first electrodes 1 has a potential that produces such a potential gradient, it is possible to prevent the carriers of the first type (electrons) from moving to the first electrode of the pixel adjacent to the pixel of interest even in the structure in which the second semiconductor layer 111 is provided such that it extends over the plurality of pixels.

In the present embodiment, the PIN-type photodiode is employed that is formed using the second impurity semiconductor layer 110 of the first conductivity type (n type) and the third impurity semiconductor layer 112 of the second conductivity type (p type), and thus the particular potential V2 is to satisfy a condition described below by a mathematical expression (F'').

$$V_1 < \frac{(\varepsilon_1/t)V_1 + (\varepsilon_2/d)V_2}{(\varepsilon_1/d) + (\varepsilon_1/t)} < V_y \qquad (F'')$$

On the other hand, in a case where the second impurity semiconductor layer 110 is of the second conductivity type (p type) and the third impurity semiconductor layer 112 is of the first conductivity type (n type), the particular potential V2 is to satisfy a condition described below by a mathematical expression (F''').

$$V_y < \frac{(\varepsilon_1/t)V_1 + (\varepsilon_2/d)V_2}{(\varepsilon_2/d) + (\varepsilon_1/t)} < V_1 \qquad (F''')$$

This makes it possible to obtain a further stable potential gradient between the first electrode 1 and the interface without causing an expansion of the dead region in the second semiconductor layer 111 between the adjacent first electrodes 1, and thus it becomes possible to further improve the sensitivity and the spatial resolution of the detection apparatus.

This is also true for a MIS-type sensor in which an insulating layer for completely isolating carriers of both positive and negative types is used instead of the second impurity semiconductor layer 110 and an impurity semiconductor layer of the first conductivity type (n type) is used as the third impurity semiconductor layer 112. Note that in the case of the MIS-type sensor, the carriers of the first type are holes while the carriers of the second type are electrons.

Another example of a structure according to the present embodiment is described below with reference to FIGS. 3A and 3B.

In the previous example, the potential of the interface is controlled by the potential difference between the third conductive layer 107 serving as the pixel isolation electrode 5 and the fifth conductive layer 113 serving as the second electrode. However, depending on the location and/or the potential of the pixel isolation electrode 5 and/or the first electrode 1, the controlling of the potential of the interface can be influenced by the potential of the adjacent first electrode 1.

Figure 3A:
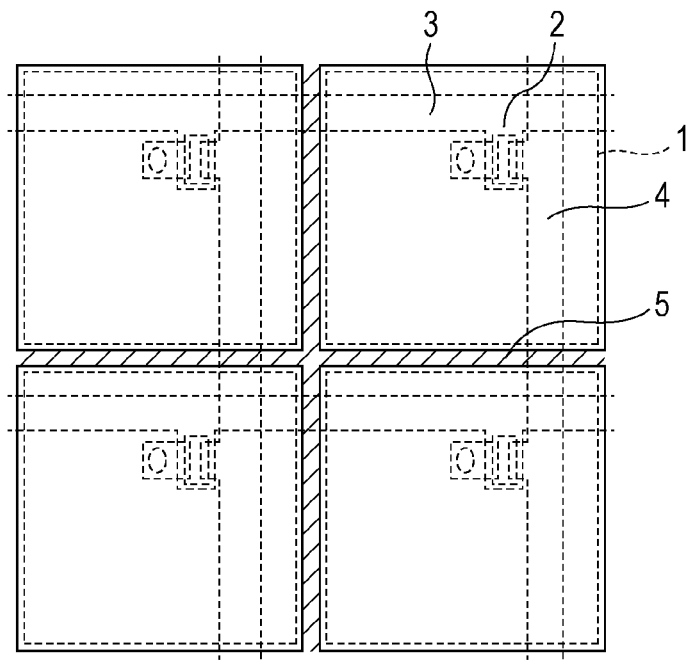
FIGS. 3A and 3B are a plan view and an enlarged cross-sectional view of a pixel of a detection apparatus according to an embodiment of the present invention.
Figure 3B:
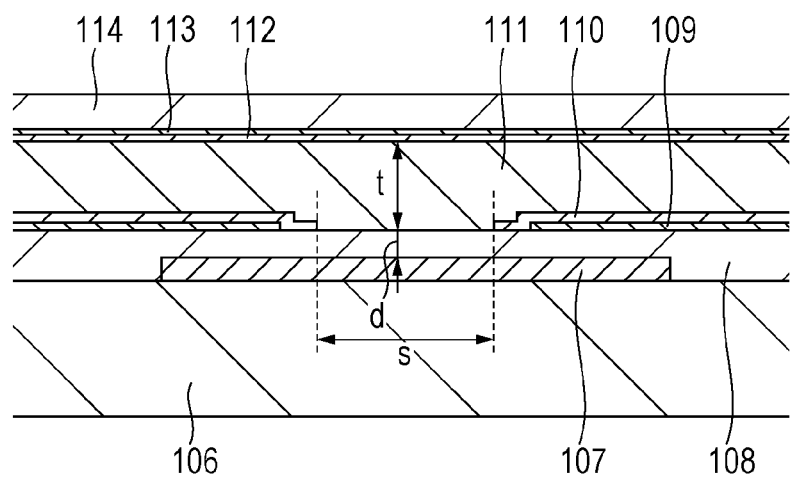

For example, when the distance between first electrodes 1 is small as in an example shown in FIGS. 3A and 3B, the potential Vx of the first electrode 1 reduces the area in which the interface has a potential equal to Vi. In an extreme case, the interface has no area in which the potential is equal to Vi. Therefore, the distance S between first electrodes 1 is to be determined such that the potential of the interface is equal to Vi at least in a partial area between the electrodes of adjacent pixels. To reduce the influence of the distance S, the film thickness d of the third insulating layer 108 may be set to be sufficiently smaller than the distance S between first electrodes 1. This makes it possible to easily control the potential Vi of the interface without being influenced by the potential Vx of the first electrode 1.

In the present example of the embodiment, a planarization layer for planarizing the shape of the third conductive layer 107 is used as the third insulating layer 108, and the film thickness d thereof is defined by the distance from the top surface of the third conductive layer 107 to the second semiconductor layer 111. This approach may also be employed in a case where the third insulating layer 108 includes a plurality of insulating layers. The same approach may also be employed in a case where the insulating layer used as the third insulating layer does not have planarization capability. An example of an insulating layer having no planarization capability is an inorganic insulating layer such as a silicon nitride insulating layer formed by plasma CVD, sputtering, etc.

In a case where a large amount of radiation or light is converted into a charge at the surface of the conversion element, the radiation or light is absorbed on the incident side with a high probability, and thus the probability is low that carriers are generated in the vicinity of the interface opposite to the incident side. However, in a case where the distance between first electrodes 1 is large or the potential of the interface is equal to Vi over a large area, there is a possibility that carriers of the first type are accumulated between adjacent first electrodes 1.

In such a case, the potential of the pixel isolation electrode 5 may be changed periodically such that the accumulated carriers of the first type move toward the first electrode 1 or the fifth conductive layer 113 serving as the second electrode to reset the accumulated carriers of the first type. For example, if the potential of the interface in this state is Vi', the potential V2' applied to the pixel isolation electrode 5 is to be set such that |Vx−Vi'|>|Vx−Vi| is satisfied before radiation or light is incident on the detection apparatus and more preferable |Vi−V1|>0 is further satisfied. By electrically connecting a unit having the above-described function to the pixel isolation electrode 5 and applying the potential determined in the above-described manner to the pixel isolation electrode 5, it is possible to reduce a bad influence of a previous image on a next image. More specifically, for example, an after-image can be reduced.

Second Embodiment

Figure 4A:
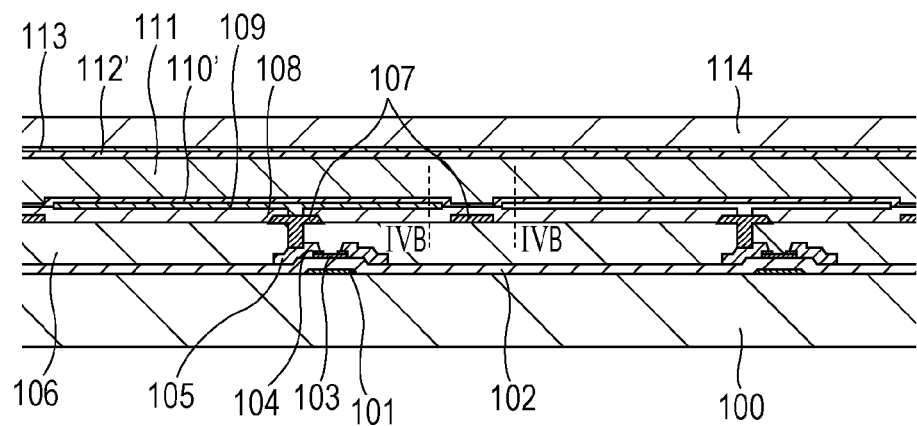
FIGS. 4A and 4B are a cross-sectional view and an enlarged cross-sectional view of a pixel of a detection apparatus according to an embodiment of the present invention.

A second embodiment of the present invention is described below with reference to FIGS. 4A and 4B.

In the first embodiment described above, the conversion element including the PIN-type photodiode is used. In contrast, in the second embodiment, a MIS-type photosensor is used. In the case of the PIN-type photodiode, the second impurity semiconductor layer 109 also functions as an electrode, and thus it is divided into parts corresponding to the respective pixels. In contrast, in the second embodiment, an interlayer insulating layer included in the MIS-type photosensor does not function as an electrode, and thus it is not divided into parts corresponding to respective pixels. In the following description, similar elements to those according to the first embodiment are denoted by similar reference numerals, and a further explanation thereof is omitted.

The MIS-type photosensor according to the present embodiment includes a second semiconductor layer disposed between a fourth conductive layer 109 serving as the first electrode 1 and a fifth conductive layer 113 serving as the second electrode and also includes an interlayer insulating layer 110' disposed between the fourth conductive layer 109 and a second semiconductor layer 111. The MIS-type photosensor also includes a second impurity semiconductor layer 112' of a first conductivity type (n type) disposed between the fifth conductive layer 113 and the second semiconductor layer 111. Note that the interlayer insulating layer 110' is not divided into parts corresponding to the respective pixels, but it extends over the plurality of pixels as with the second semiconductor layer 111.

Figure 4B:
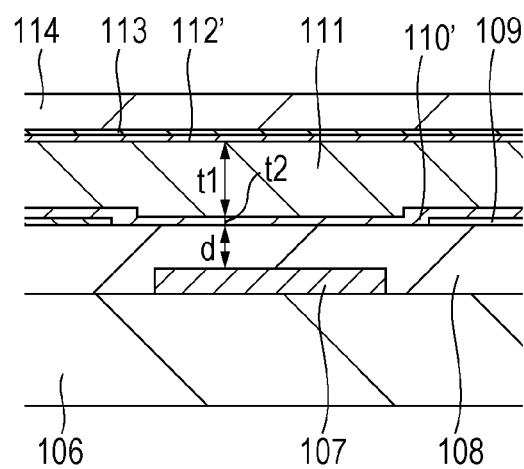

In FIG. 4B, t1 denotes the film thickness of the second semiconductor layer 111, and t2 denotes the film thickness of the interlayer insulating layer 110' disposed between the second semiconductor layer 111 and a third conductive layer 107 serving as the pixel isolation electrode 5. Furthermore, d denotes the film thickness of a third insulating layer 108 disposed between the second semiconductor layer 111 and the third conductive layer 107 serving as the pixel isolation electrode 5. Herein, let ∈1 denote the dielectric constant of the second semiconductor layer 111, ∈2 denote the dielectric constant of the interlayer insulating layer 110', and ∈3 denote the dielectric constant of the third insulating layer 108. Furthermore, let V1 denote the potential of the fifth conductive layer 113 serving as the second electrode and V2 denote the particular potential to be applied to the pixel isolation electrode 5. In this structure, according to the same approach as that employed in the first embodiment, the potential of the at least partial region of the interface of the second semiconductor layer 111 and the third insulating layer 108 is set to Vi satisfying a following condition (G).

$$V_i = \frac{((\varepsilon_1/t_1)(\varepsilon_2/t_2) + (\varepsilon_3/d)(\varepsilon_1/t_1))V_1 + (\varepsilon_2/t_2)(\varepsilon_3/d)V_2}{(\varepsilon_1/t_1)(\varepsilon_2/t_2) + (\varepsilon_2/t_2)(\varepsilon_3/d) + (\varepsilon_3/d)(\varepsilon_1/t_1)} \quad (G)$$

Furthermore, according to the same approach as that employed in the first embodiment, the particular potential V2 applied to the pixel isolation electrode 5 is set so as to satisfy a condition described by mathematical expressions (H) to (K) shown below.

$$\left| V_1 - \frac{((\varepsilon_1/t_1)(\varepsilon_2/t_2) + (\varepsilon_3/d)(\varepsilon_1/t_1))V_1 + (\varepsilon_2/t_2)(\varepsilon_3/d)V_2}{(\varepsilon_1/t_1)(\varepsilon_2/t_2) + (\varepsilon_2/t_2)(\varepsilon_3/d) + (\varepsilon_3/d)(\varepsilon_1/t_1)} \right| < |V_1 - V_x| \quad (H)$$

-continued $$\left|\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}-V_x\right|\neq 0 \quad (I)$$

$$\left|V_1-\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}\right|\neq 0 \quad (J)$$

$$\left|\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}-V_x\right|<|V_1-V_x| \quad (K)$$

In the present embodiment, the MIS-type photosensor described above is used, and thus the particular potential V2 is to satisfy a condition described in a mathematical expression (L) shown below.

$$V_x<\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}<V_1 \quad (L)$$

This makes it possible to obtain a stable potential gradient between the first electrode 1 and the interface without causing an expansion of the dead region in the second semiconductor layer 111 between the adjacent first electrodes 1, and thus it becomes possible to improve the sensitivity and the spatial resolution of the detection apparatus. In a case where the potential of the first electrode 1 changes from Vx to Vy due to a charge generated by radiation or light incident on the second semiconductor layer 111, if the conversion element is not in a saturated state, the particular potential V2 applied to the pixel isolation electrode 5 is to satisfy a condition represented by mathematical expressions (H') to (K') shown below.

$$\left|V_1-\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}\right|<|V_1-V_y| \quad (H')$$

$$\left|\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}-V_y\right|\neq 0 \quad (I')$$

$$\left|V_1-\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}\right|\neq 0 \quad (J')$$

$$\left|\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}-V_y\right|<|V_1-V_y| \quad (K')$$

When the potential of the pixel isolation electrode 5 satisfies the condition represented by the above mathematical expressions, even if a charge is generated only in one of two adjacent pixels, a potential gradient is generated such that carriers are moved not to the interface but to the first electrode 1. Such a potential gradient along the interface in the region between the adjacent first electrodes 1 makes it possible to prevent the carriers of the first type (holes) from moving to the first electrode of the adjacent pixel even in the structure in which the second semiconductor layer 111 is provided such that it extends over the plurality of pixels. More specifically, in the present embodiment, the MIS-type photosensor described above is used, and thus the particular potential V2 is to satisfy a condition described in a mathematical expression (L') shown below.

$$V_y<\frac{((\varepsilon_1/t_1)(\varepsilon_2/t_2)+(\varepsilon_3/d)(\varepsilon_1/t_1))V_1+(\varepsilon_2/t_2)(\varepsilon_3/d)V_2}{(\varepsilon_1/t_1)(\varepsilon_2/t_2)+(\varepsilon_2/t_2)(\varepsilon_3/d)+(\varepsilon_3/d)(\varepsilon_1/t_1)}<V_1 \quad (L')$$

This makes it possible to obtain a further stable potential gradient between the first electrode 1 and the interface without causing an expansion of the dead region in the second semiconductor layer 111 between the adjacent first electrodes 1, and thus it becomes possible to further improve the sensitivity and the spatial resolution of the detection apparatus.

Third Embodiment

Referring to FIG. 5, a radiation detection system using a detection apparatus according to an embodiment of the present invention is described below. Radiation 6060 generated by a radiation source 6050 passes through a chest 6062 of a patient or a subject 6061 and is incident on the detection apparatus 6040 according to the present embodiment of the invention. The incident radiation includes information on the inside of the body of the patient 6061. In response to the incident radiation, a scintillator (wavelength conversion element) in the detection apparatus 6040 emits light. The emitted light is converted into electric information. The electric information is converted into a digital signal and is subjected to image processing by an image processor 6070 serving as a signal processing unit. A resultant image is displayed on a display 6080 serving as a display unit installed in a control room. The obtained information may be transferred to a remote location by a transmitting unit via a telephone line 6090 or the like. The information may be displayed on a display 6081 serving as a display unit installed in a doctor room at the remote location or it may be stored in a storage medium such as an optical disk. This allows a doctor at the remote location to make a diagnosis. The information may be recorded on a film 6110 serving as a recording medium by a film processor 6100 serving as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-260522 filed Nov. 22, 2010, which is hereby incorporated by reference herein in its entirety.

What is claimed is:

1. A detection apparatus comprising:
 a plurality of conversion elements disposed in the form of a matrix on a substrate, wherein the conversion elements include a plurality of first electrodes corresponding to the respective conversion elements and separated away from each other, a second electrode extending over the plurality of conversion elements, and a semiconductor layer formed between the plurality of first electrodes and the second electrode extending over the plurality of conversion elements;
 a plurality of switch elements connected in a one-to-one manner to the respective first electrodes and disposed in the form of a matrix between the substrate and the plurality of conversion elements;
 a plurality of insulating layers disposed between the plurality of conversion elements and the plurality of switch elements, wherein the plurality of insulating layers include a plurality of first regions located immediately below the respective first electrodes and also includes a second region located between the first regions; and a third electrode supplied with a potential that sets a potential of a part where the second region of the plurality of insulating layers is in contact with the semiconductor layer such that the potential of the part is between a potential of the second electrode and a potential of the first electrode, wherein the third electrode is disposed in the second region and between adjacent two insulating layers of the plurality of insulating layers.

2. The detection apparatus according to claim 1, wherein when an accumulation state starts in one of the conversion elements, the potential supplied to the third electrode satisfies a condition described by following mathematical expressions, $$\left| V_1 - \frac{(\varepsilon_1/t)V_1 + (\varepsilon_2/d)V_2}{(\varepsilon_2/d) + (\varepsilon_1/t)} \right| < |V_1 - V_x|$$

$$\left| \frac{(\varepsilon_1/t)V_1 + (\varepsilon_2/d)V_2}{(\varepsilon_2/d) + (\varepsilon_1/t)} - V_x \right| \neq 0$$

$$\left| V_1 - \frac{(\varepsilon_1/t)V_1 + (\varepsilon_2/d)V_2}{(\varepsilon_2/d) + (\varepsilon_1/t)} \right| \neq 0$$

$$\left| \frac{(\varepsilon_1/t)V_1 + (\varepsilon_2/d)V_2}{(\varepsilon_2+d) + (\varepsilon_1/t)} - V_x \right| < |V_1 - V_x|$$

where V2 denotes the potential supplied to the third electrode, V1 denotes a potential supplied to the second electrode, Vx denotes a reference potential of the first electrodes, $\in_1$ denotes a dielectric constant of the semiconductor layer, t denotes a film thickness of the semiconductor layer, $\in_2$ denotes a dielectric constant of an insulating layer that is one of the plurality of insulating layers and that is located between the semiconductor layer and the third electrode, and d denotes a film thickness of the insulating layer that is one of the plurality of insulating layers and that is located between the semiconductor layer and the third electrode.

3. The detection apparatus according to claim 2, wherein
each of the switch elements includes a first impurity semiconductor layer of an n type,
each of the conversion elements further includes a second impurity semiconductor layer of the n type disposed between a corresponding one of the first electrodes and the semiconductor layer, and includes a third impurity semiconductor layer of a p type disposed between the semiconductor layer and the second electrode, and
the potential V2 supplied to the third electrode satisfies a condition described by a following mathematical expression, $$V_1 < \frac{(\varepsilon_1/t)V_1 + (\varepsilon_2/d)V_2}{(\varepsilon_2/d) + (\varepsilon_1/t)} < V_x.$$

4. The detection apparatus according to claim 2, wherein
each of the switch elements includes a first impurity semiconductor layer of an n type,
each of the conversion elements further includes a second impurity semiconductor layer of a p type disposed between a corresponding one of the first electrodes and the semiconductor layer and a third impurity semiconductor layer of the n type disposed between the semiconductor layer and the second electrode, and wherein the potential V2 supplied to the third electrode satisfies a following condition described by following mathematical expressions, $$V_x < \frac{(\varepsilon_1/t)V_1 + (\varepsilon_2/d)V_2}{(\varepsilon_2/d) + (\varepsilon_1/t)} < V_1.$$

5. The detection apparatus according to claim 2, wherein
each of the switch elements includes a first impurity semiconductor layer of an n type,
each of the conversion elements further includes an interlayer insulating layer divided into parts corresponding to the respective pixels and disposed between a corresponding one of the first electrodes and the semiconductor layer, and a third impurity semiconductor layer of the n type disposed between the semiconductor layer and the second electrode,
and wherein the potential V2 supplied to the third electrode satisfies a following condition described by following mathematical expressions, $$V_x < \frac{(\varepsilon_1/t)V_1 + (\varepsilon_2/d)V_2}{(\varepsilon_2/d) + (\varepsilon_1/t)} < V_1.$$

6. The detection apparatus according to claim 1, wherein
each of the switch elements includes a first impurity semiconductor layer of an n type,
each of the conversion elements further includes an interlayer insulating layer extending between the semiconductor layer and the first electrodes over the plurality of pixels and also includes a third impurity semiconductor layer of the n type disposed between the semiconductor layer and the second electrode,
and wherein the potential supplied to the third electrode satisfies a following condition described by following mathematical expressions, $$\left| V_1 - \frac{((\varepsilon_1/t_1)(\varepsilon_2/t_2) + (\varepsilon_3/d)(\varepsilon_1/t_1))V_1 + (\varepsilon_2/t_2)(\varepsilon_3/d)V_2}{(\varepsilon_1/t_1)(\varepsilon_2/t_2) + (\varepsilon_2/t_2)(\varepsilon_3/d) + (\varepsilon_3/d)(\varepsilon_1/t_1)} \right| < |V_1 - V_x|$$

$$\left| \frac{((\varepsilon_1/t_1)(\varepsilon_2/t_2) + (\varepsilon_3/d)(\varepsilon_1/t_1))V_1 + (\varepsilon_2/t_2)(\varepsilon_3/d)V_2}{(\varepsilon_1/t_1)(\varepsilon_2/t_2) + (\varepsilon_2/t_2)(\varepsilon_3/d) + (\varepsilon_3/d)(\varepsilon_1/t_1)} - V_x \right| \neq 0$$

$$\left| V_1 - \frac{((\varepsilon_1/t_1)(\varepsilon_2/t_2) + (\varepsilon_3/d)(\varepsilon_1/t_1))V_1 + (\varepsilon_2/t_2)(\varepsilon_3/d)V_2}{(\varepsilon_1/t_1)(\varepsilon_2/t_2) + (\varepsilon_2/t_2)(\varepsilon_3/d) + (\varepsilon_3/d)(\varepsilon_1/t_1)} \right| \neq 0$$

$$\left| \frac{((\varepsilon_1/t_1)(\varepsilon_2/t_2) + (\varepsilon_3/d)(\varepsilon_1/t_1))V_1 + (\varepsilon_2/t_2)(\varepsilon_1/d)V_2}{(\varepsilon_1/t_1)(\varepsilon_2/t_2) + (\varepsilon_3/d)(\varepsilon_3/d) + (\varepsilon_3/d)(\varepsilon_1/t_1)} - V_x \right| < |V_1 - V_x|$$

$$V_x < \frac{((\varepsilon_1/t_1)(\varepsilon_2/t_2) + (\varepsilon_3/d)(\varepsilon_1/t_1))V_1 + (\varepsilon_2/t_2)(\varepsilon_3/d)V_2}{(\varepsilon_1/t_1)(\varepsilon_2/t_2) + (\varepsilon_3/t_2)(\varepsilon_3/d) + (\varepsilon_3/d)(\varepsilon_1/t_1)} < V_1$$

where V2 denotes the potential supplied to the third electrode, V1 denotes a potential supplied to the second electrode, Vx denotes a reference potential supplied to the first electrode, $\in_1$ denotes a dielectric constant of the semiconductor layer, t1 denotes a film thickness of the semiconductor layer, $\in_2$ denotes a dielectric constant of the interlayer insulating layer, t2 denotes a film thickness of the interlayer insulating layer, $\in_3$ denotes a dielectric constant of an insulating layer that is one of the plurality of insulating layers and that is disposed between the semiconductor layer and the third electrode, and d denotes a film thickness of the insulating layer that is one of the plurality of insulating layers and that is disposed between the semiconductor layer and the third electrode.

7. A radiation detection system comprising:
the detection apparatus according to claim 1;
a signal processing unit configured to process a signal from the detection apparatus;
a storage unit configured to store a signal from the signal processing unit;
a display unit configured to display the signal from the signal processing unit;
a transmission unit configured to transmit the signal from the signal processing unit; and
a radiation source configured to generate radiation.

* * * * *